(12) United States Patent
Ruppert

(10) Patent No.: US 11,584,246 B2
(45) Date of Patent: Feb. 21, 2023

(54) CHARGING PLUG FOR A CHARGING STATION FOR TRANSFERRING ELECTRIC ENERGY AND A CHARGING SYSTEM THEREFOR

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 250 days.

(21) Appl. No.: 16/910,570

(22) Filed: Jun. 24, 2020

(65) Prior Publication Data
US 2020/0406770 A1 Dec. 31, 2020

(30) Foreign Application Priority Data

Jun. 28, 2019 (DE) .......................... 102019209467.8

(51) Int. Cl.
*H02J 7/00* (2006.01)
*H02J 7/14* (2006.01)
(Continued)

(52) U.S. Cl.
CPC ............. *B60L 53/302* (2019.02); *B60L 50/66* (2019.02); *B60L 53/16* (2019.02);
(Continued)

(58) Field of Classification Search
CPC ........ B60L 53/302; B60L 53/16; B60L 53/34; B60L 50/66; H01L 23/3672; H01L 23/467; H02J 7/0045; H02R 2201/26
(Continued)

(56) References Cited

U.S. PATENT DOCUMENTS

| 5,600,222 A * | 2/1997 | Hall ...................... B60L 53/122 |
| | | 320/108 |
| 2001/0003414 A1* | 6/2001 | Kajiura ................... H02J 7/025 |
| | | 320/108 |

(Continued)

FOREIGN PATENT DOCUMENTS

| CN | 205544922 U | 8/2016 |
| CN | 207150192 U | 3/2018 |

(Continued)

OTHER PUBLICATIONS

German Search Report dated Jul. 14, 2020, in connection with corresponding DE Application No. 10 2019 209 467.8 (21 pp., including machine-generated English translation).

(Continued)

*Primary Examiner* — Alexis B Pacheco
(74) *Attorney, Agent, or Firm* — Maier & Maier, PLLC

(57) ABSTRACT

A system for transferring electrical energy from a charging station to an electrical consumer including a charging plug connected to the charging station by a charging cable and a charging socket corresponding to the charging plug of the electrical consumer designed as a motor vehicle, wherein the motor vehicle is designed to receive a battery voltage at the charging socket and relay it, unchanged, to a vehicle battery, wherein the charging station is configured to receive a network voltage from a power grid and to relay it via a charging cable to the charging plug, and the charging plug is configured to convert the network voltage into the battery voltage by means of power electronics.

7 Claims, 2 Drawing Sheets

(51) Int. Cl.
  B60L 53/302 (2019.01)
  H01R 13/66 (2006.01)
  H01L 23/367 (2006.01)
  B60L 53/16 (2019.01)
  B60L 50/60 (2019.01)
  H01L 23/467 (2006.01)

(52) U.S. Cl.
  CPC ........ H01L 23/3672 (2013.01); H01L 23/467 (2013.01); H01R 13/665 (2013.01); H02J 7/0045 (2013.01); *H01R 2201/26* (2013.01)

(58) Field of Classification Search
  USPC .................................................. 320/109, 104
  See application file for complete search history.

(56) References Cited

U.S. PATENT DOCUMENTS

| | | | |
|---|---|---|---|
| 2014/0266017 A1* | 9/2014 | Hamada | H02J 5/00 320/107 |
| 2016/0272075 A1 | 9/2016 | Biagini et al. | |
| 2019/0109409 A1* | 4/2019 | Fuehrer | H01R 13/533 |
| 2019/0168626 A1* | 6/2019 | Spesser | B60L 53/16 |
| 2019/0344674 A1* | 11/2019 | Arai | B60L 53/16 |
| 2020/0275582 A1* | 8/2020 | Wu | H05K 7/20218 |
| 2021/0008992 A1* | 1/2021 | Liu | B60L 53/302 |
| 2022/0153153 A1* | 5/2022 | Garcia-Ferre | B60L 53/18 |

FOREIGN PATENT DOCUMENTS

| | | |
|---|---|---|
| CN | 208134122 U | 11/2018 |
| CN | 208469578 U | 2/2019 |
| DE | 10 2012 011 606 A1 | 12/2013 |
| DE | 11 2012 005 145 T5 | 10/2014 |
| DE | 102015101140 A1 | 7/2016 |
| DE | 102016204894 A1 | 9/2017 |
| DE | 102016211464 A1 | 12/2017 |
| DE | 10 2017 222 808 A1 | 6/2019 |

OTHER PUBLICATIONS

Technical manual, DIN EN 62196-1 (VDE 0623-5-1), "Plugs, sockets, vehicle couplings and vehicle plugs—Conductive charging of electric vehicle—Part 1: General requirements (IEC 62196-1:2014, modified); German version EN 62196-1:2014", DKE German Commission electrical engineering electronics information technology in DIN and VDE, DIN German Institute for Standardization e.V. and VDE Association of Electrical Engineering Electronics Information Technology e.V., Jun. 2015 (192 pp., including machine-generated English translation).
Office Action dated Oct. 10, 2022, in corresponding Chinese Application No. 202010595185.0, 19 pages.

* cited by examiner

CHARGING PLUG FOR A CHARGING STATION FOR TRANSFERRING ELECTRIC ENERGY AND A CHARGING SYSTEM THEREFOR

FIELD

The disclosure relates to a charging plug for a charging station for transferring electric energy. Furthermore, the invention relates to a charging system therefor.

BACKGROUND

A charging plug for a charging station for transferring electric energy from the charging station to an electrical consumer, in particular an electrically operated vehicle, is known from the prior art. In this case, the charging plug comprises at least one contact element for the electrical and reversibly detachable coupling of the charging plug to a corresponding charging socket of the electrical consumer and a connecting element for charging cable of the charging station. When electrical energy is transferred, in particular at high charging currents, heat to be dissipated can arise, for example, at least one contact element. To dissipate heat, for example, a cooling unit having a cooling element can be used, wherein the cooling element forms a part of a wall of a housing of the charging plug.

In this context, DE 10 2016 211 464 A1 describes a charging plug which comprises at least one power contact, wherein the at least one power contact is actively cooled by means of a Peltier element. Furthermore, the Peltier element can be sandwiched between the at least one power contact and a cooling element, preferably comprising a cooling fin. The cooling element preferably comprises a cooling fluid duct arranged inside the cooling element and can have a cooling fluid, such as water, ketones, nitrogen, or pressurized breathing air, flow through it.

DE 10 2016 204 894 A1 discloses a charging plug having at least one power contact arranged in a charging plug housing, which is connected in a formfitting manner by means of a cooling unit comprising a dielectric material.

Furthermore, DE 10 2015 101 140 A1 describes a charging station having a charging plug coupled to the charging station by means of a supply cable and a cooling unit, by means of which a charging plug located in a parking position can be cooled. The cooling unit is preferably designed as a blower unit, by means of which a gaseous cooling fluid flow can be generated, in particular from ambient air.

The object of the present invention is to refine a charging plug and a charging system to implement a charging procedure, which is particularly flexible, is implementable with little circuit complexity, and is protected from overheating, for transferring electric energy from a charging station to an electrical consumer.

A charging plug for a charging station for transferring electric energy from the charging station to a corresponding charging socket of an electrical consumer, in particular an electrically driven motor vehicle, is provided by the invention. The charging plug is, for example, a charging plug of a combined charging system (Combined Charging System or Combo 2 or CCS) for AC and DC charging based on IEC 62196. As already stated above, in this case the charging plug comprises at least one contact element for electrical coupling to the charging socket of the consumer, an at least mechanically connecting connecting element for a charging cable of the charging station, and a cooling unit for dissipating heat. Furthermore, the charging plug comprises at least one semiconductor element, wherein the at least one semiconductor element is arranged on at least one cooling element of the cooling unit. The cooling element forms part of a wall of a housing of the charging plug here. For example, the at least one cooling element is a heat sink, which enlarges a heat-emitting surface of the at least one semiconductor element to prevent damage due to overheating.

According to the invention, the charging plug comprises integrated power electronics, wherein a control unit of the power electronics is configured to actuate the at least one semiconductor element as a part of the integrated power electronics for switching and/or converting electric energy. In other words, the integrated power electronics are installed in the charging plug and the power electronics comprise the at least one semiconductor element, for example, a power converter based on power semiconductors and/or a switch (for example, at least one transistor, such as a MOSFET or CMOS transistor). By means of the power converter, for example, a network voltage (for example, an AC voltage) received from a power grid can be converted into a battery voltage (i.e., in particular a DC voltage) required for a battery of the electrical consumer. Furthermore, a frequency of the electric voltage required for the electrical consumer can be set for the transport of the energy. Alternatively or additionally, the electrical consumer can be switched on and off as required, for example, by means of the switch. The power electronics required for this are part of the charging plug here. The advantage thus results that installing the power electronics in the electrical consumer and/or in the charging station can be omitted.

The charging plug can thus be flexibly used in a multifunctional manner as a mechanical connecting element to the charging socket, as a handling element for a user, and as an electrical control element. Furthermore, the power electronics in the charging plug are easily accessible for maintenance and/or repair of the at least one semiconductor element.

The invention is based on the finding that charging plugs will in future require integration of the power electronics comprising the at least one semiconductor element into the charging plug or into the housing of the charging plug. As a result, active cooling of the at least one semiconductor element through the watertight and/or dust-proof housing is required to dissipate heat or avoid overheating.

The invention also includes embodiments which result in additional advantages.

One embodiment provides that the cooling unit comprises a cooling assembly arranged on the housing for generating a cooling air flow in the direction of an outwardly oriented surface of the at least one cooling element. In other words, the cooling air flow generated by means of the cooling assembly flows along an outer side of the at least one cooling element to guide the sufficiently large cooling air flow along the at least one cooling element. An outward freestanding surface of the at least one cooling element is thus cooled by the cooling air flow flowing past it. For example, the cooling air flow can be generated by means of a turbomachine in that it emits flow energy to the ambient air, and the cooling air flow is guided by means of baffle plates in the direction of the at least one cooling element. The advantage thus results that cooling ducts inside the at least one cooling element can be omitted and thus complex maintenance and/or sealing is dispensed with. Furthermore, the robustly designed at least one cooling element and the separate cooling assembly, which is thus not integrated into the at least one cooling element, permit particularly simple operation of the cooling unit.

A further embodiment provides that the cooling assembly is designed as a fan for generating forced convection of the cooling air flow. In other words, by means of mechanical action of the fan, i.e., a blower, pressure differences are generated which induce flowing of the cooling air flow, i.e., air circulation for dissipating heat. The fan is, for example, an axial fan, a radial fan, or a tangential fan. It is advantageous that the fan as a cooling assembly is a flexible component having low acquisition costs and/or low operating costs.

A further embodiment of this provides that the cooling assembly is arranged in a portion of the charging plug adjoining a handle bracket and/or on the wall of the housing arranged on the connecting element. In other words, the cooling assembly is arranged between the handle bracket and a recessed grip of a handle of the charging plug. If the cooling assembly is arranged in the region adjoining the handle bracket, the cooling assembly can also be used to cool or blow on the handle. Alternatively or additionally, the cooling assembly is arranged on the wall of the housing associated with the connecting element and in particular in parallel to a longitudinal extension direction of a charging cable in the region associated with the connecting element. If the cooling assembly is arranged on the outer side of the connecting element, the advantage results that a user grasping the handle is outside an area of effect of the cooling assembly and cannot be irritated, i.e., surprised, by the dissipation of the heat. In general, the advantage also results that the cooling assembly is easily accessible from the outside and/or is easily replaceable if needed, for example, if requirements change for a performance of the cooling assembly.

A further embodiment provides that the at least one cooling element and the at least one semiconductor element arranged thereon is arranged in a recessed grip of a handle of the charging plug and/or the wall of the housing opposite to the handle. In other words, the at least one cooling element is arranged in parallel to a longitudinal extension direction of the handle in the recessed grip on the outer side of the housing of the charging plug. If the cooling unit is arranged in the recessed grip, the at least one heat-generating semiconductor element can also be used for heating the handle if required. Alternatively or additionally, the at least one cooling element can be arranged on the wall of the housing opposite to the handle, for example, arranged in parallel to a longitudinal extension direction of the at least one contact element on the outer side of the housing. This has the advantage that when the charging plug is handled as intended, that is to say when the charging plug is only grasped by the handle, a user is located outside a heat zone of the at least one semiconductor element and/or the cooling element arranged thereon and unintentional touching of the heat zone by the user is prevented.

A further embodiment provides that the control unit is configured to actuate the cooling unit in dependence on a temperature, detected by means of a sensor unit of the charging plug, of the surroundings of the charging plug and/or the at least one semiconductor element of the power electronics. In other words, a signal is generated as a measure of the temperature by means of the sensor unit, wherein the sensor unit is designed, for example, as a power semiconductor. For example, actuation of the cooling unit by means of the control unit can take place if the detected temperature exceeds a predetermined temperature threshold.

The temperature of the surroundings of the charging plug can be ascertained in this case so that an influence of the temperature of the surroundings on the power electronics can be taken into consideration promptly. For example, it can be necessary to activate the cooling unit early due to intensive sunlight. Alternatively or additionally, it can be provided that the temperature of the at least one semiconductor element of the power electronics is ascertained to metrologically detect a heat loss generated during operation of the at least one semiconductor of the power electronics. As a result, the power electronics and in particular the at least one semiconductor element can be protected from overheating. The advantage thus results that the cooling unit can be activated automatically in dependence on the detected temperature and manual activation can be omitted.

A further embodiment provides that the at least one cooling element comprises a heat sink having at least one cooling fin for dissipating the heat. In other words, the heat sink and in particular the at least one cooling fin increases a heat-emitting surface of the at least one heat-producing semiconductor element. The heat sink and/or the at least one cooling fin can in particular comprise thermally-conductive materials, such as metals and/or ceramics. The advantage those results that waste heat of the at least one semiconductor element can be emitted particularly efficiently by means of thermal radiation and/or convection into the surroundings.

A further embodiment provides that the at least one semiconductor element is arranged in an electrically isolated manner on the at least one cooling element by means of a thermally-conductive adhesive and/or a thermally-conductive pad and/or a thermally-conductive paste. In other words, a thermally-conductive medium, i.e., the thermally-conductive adhesive, the thermally-conductive pad, and/or the thermally-conductive paste, is sandwiched between the at least one semiconductor element and the at least one cooling element in an electrically insulating manner. The at least one semiconductor element can press directly against the at least one cooling element in this case. In order to increase the thermal conductivity, for example, a two-component adhesive, in particular based on epoxy or silicone, can be used as the thermally-conductive adhesive, and a mica disk or a ceramic disk can be used as the thermal pad. The thermally-conductive paste can be produced, for example, based on silicone oil or zinc oxide. The advantage thus results that the thermally-conductive medium improves a heat transfer, i.e., a thermal coupling between the at least one semiconductor element and the at least one cooling element, whereby the dissipation of the heat can be efficiently implemented.

A further embodiment provides that the power electronics include a rectifier, in particular a rectifier having an active harmonic filter, and/or a DC chopper, in particular an electrically isolated DC chopper, and/or a semiconductor switch, in particular a semiconductor relay, for switching and/or converting the electric energy. In other words, the power electronics comprise at least one electrical component, in particular the at least one semiconductor element, by means of which an AC voltage is converted into a DC voltage and/or a supplied DC voltage level is converted into another DC voltage level and/or an electrically conductive connection is established or interrupted. The rectifier can in particular comprise the active harmonic filter, i.e., an active power factor correction filter (PFC), to suppress undesired harmonics by means of a step-up converter connected directly downstream of the rectifier. Alternatively or additionally, the DC chopper or DC-DC converter can be designed in particular as an electrically isolated DC chopper in order to provide a required electrical insulation between an input voltage and an output voltage. Alternatively or additionally, the semiconductor switch, a so-called electronic switch, can be a semiconductor relay (Solid State Relay or SSR) for implementing an on and off switching effect. The advantage thus results that the power electronics can be implemented particularly simply and flexibly by means of the at least one electrical component.

A charging system for transferring electric energy from a charging station to an electrical consumer is provided by the invention. The charging system comprises a charging plug connected by means of a charging cable to the charging station and a charging socket corresponding to the charging plug of the electrical consumer designed as a motor vehicle. In this case, the motor vehicle is designed to receive a battery voltage at the charging socket and to relay it, unconverted, i.e., unchanged, to a vehicle battery of the motor vehicle. The motor vehicle is preferably designed as an automobile, in particular as a passenger vehicle or truck, or as a passenger bus or motorcycle. Furthermore, the charging station is configured to receive a network voltage from a power grid and to relay it via a charging cable to the charging plug. Furthermore, the charging plug is configured to convert the network voltage into the battery voltage by means of power electronics. In other words, a conversion of the network voltage into the battery voltage is carried out by means of the power electronics integrated into the charging plug. The advantage thus results that due to the integrated power electronics of the charging plug, an integration of the power electronics in the electrical consumer, i.e., the motor vehicle, and/or into the charging station can be omitted. A charging process can thus be implemented flexibly and efficiently for the motor vehicle.

The invention also includes refinements of the charging system according to the invention, which comprise features as have already been described in conjunction with the refinements of the charging plug according to the invention. For this reason, the corresponding refinements of the charging system according to the invention are not even described here.

The invention also comprises the combinations of the features of the described embodiments.

BRIEF DESCRIPTION OF THE DRAWINGS

Exemplary embodiments of the invention are described hereinafter. In the figures.

DETAILED DESCRIPTION

The exemplary embodiments explained hereinafter are preferred embodiments of the invention. In the exemplary embodiments, the described components of the embodiments each represent individual features of the invention to be considered independently of one another, which each also refine the invention independently of one another. Therefore, the disclosure is also intended to comprise combinations of the features of the embodiments other than those shown. Furthermore, the described embodiments can also be supplemented by further features of the invention that have already been described.

In the figures, identical reference signs each identify functionally-identical elements.

Figure 1:
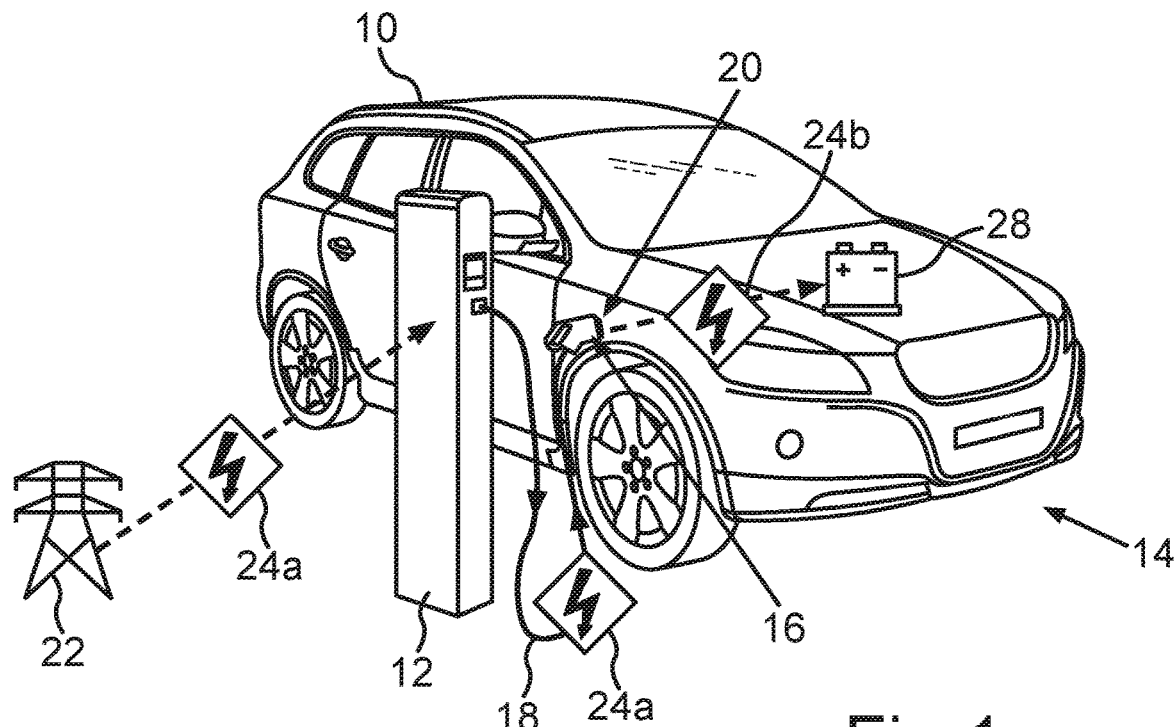
FIG. 1 shows a charging station for transferring electric energy having a motor vehicle coupled to the charging station.

The exemplary embodiment shown in FIG. 1 can be based on the following situation as an example. An electrically drivable motor vehicle 10, in particular an electric vehicle or a hybrid vehicle, is located at an electrical charging station 12. To transfer electric energy from the charging station 12 to an electrical consumer 14 designed as a motor vehicle 10, the charging station 12 can be connected by means of a charging plug 16, which is connected by means of a charging cable 18 to the charging station 12, to a charging socket 20 of the motor vehicle 10 corresponding to the charging plug 16. The above-mentioned components 10, 12, 14, 16, 18, 20 can form a charging system 100 here.

To carry out a charging procedure, i.e., to transfer the electric energy, the charging station 12 receives a network voltage 24a (for example, a single-phase or multiphase AC voltage) from a power grid 22 and relays it via the charging cable 18 of the charging station 12 to the charging plug 16. By means of power electronics 26 integrated into the charging plug 16, the network voltage 24a is converted into a battery voltage 24b, which is received at the charging socket 20 of the motor vehicle 10 and is relayed to a vehicle battery 28 without being converted. The battery voltage 24b can in particular be a DC voltage that is applied directly or unchanged to the vehicle battery 28. The setting of a voltage value required for this purpose can take place in power electronics 26. For this purpose, a target voltage value can be received from the motor vehicle 10.

Figure 2:
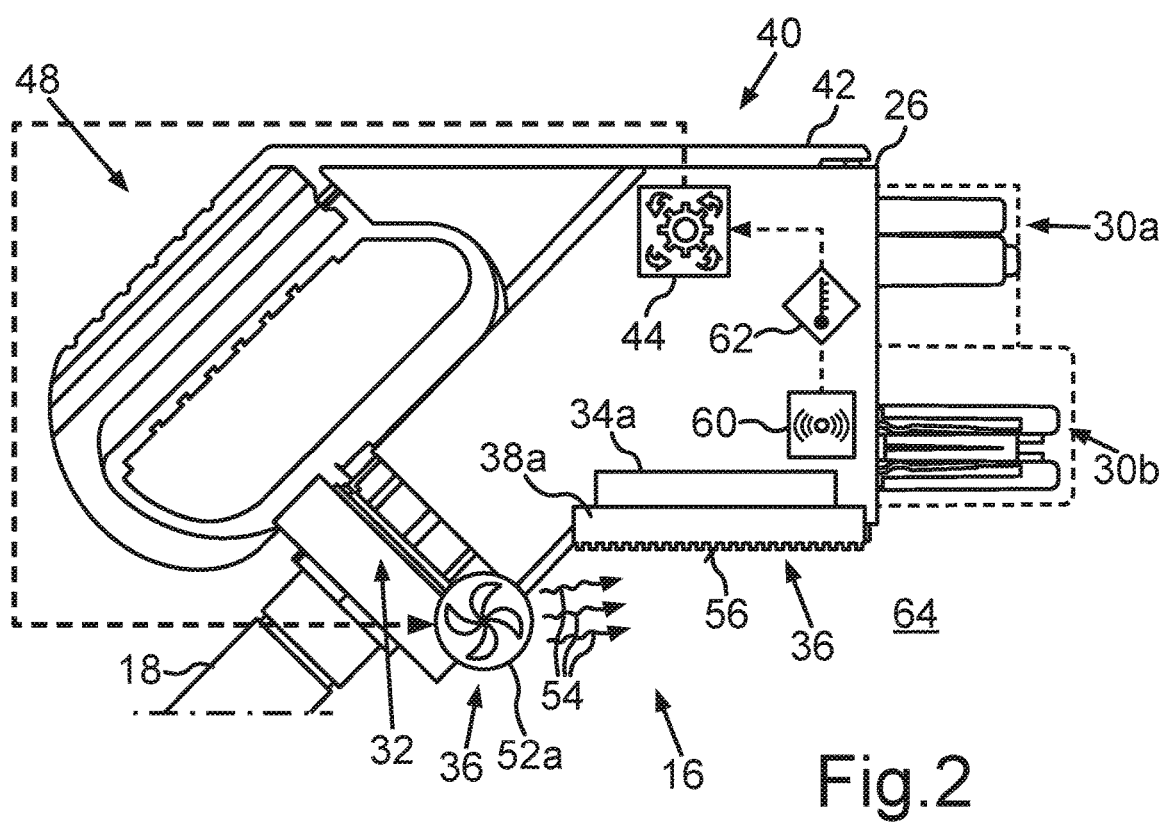
FIG. 2 schematically shows a charging plug of the charging station having a first arrangement of the cooling unit.
Figure 3:
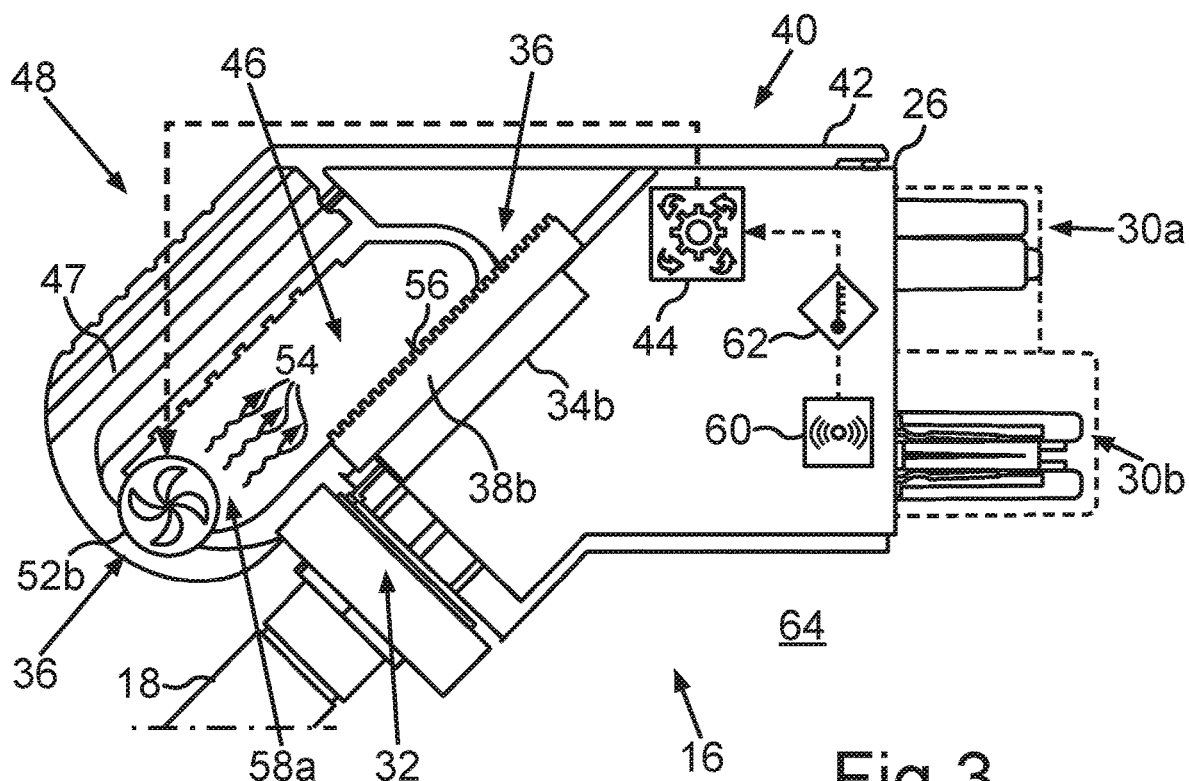
FIG. 3 schematically shows the charging fog having a second arrangement of the cooling unit.
Figure 4:
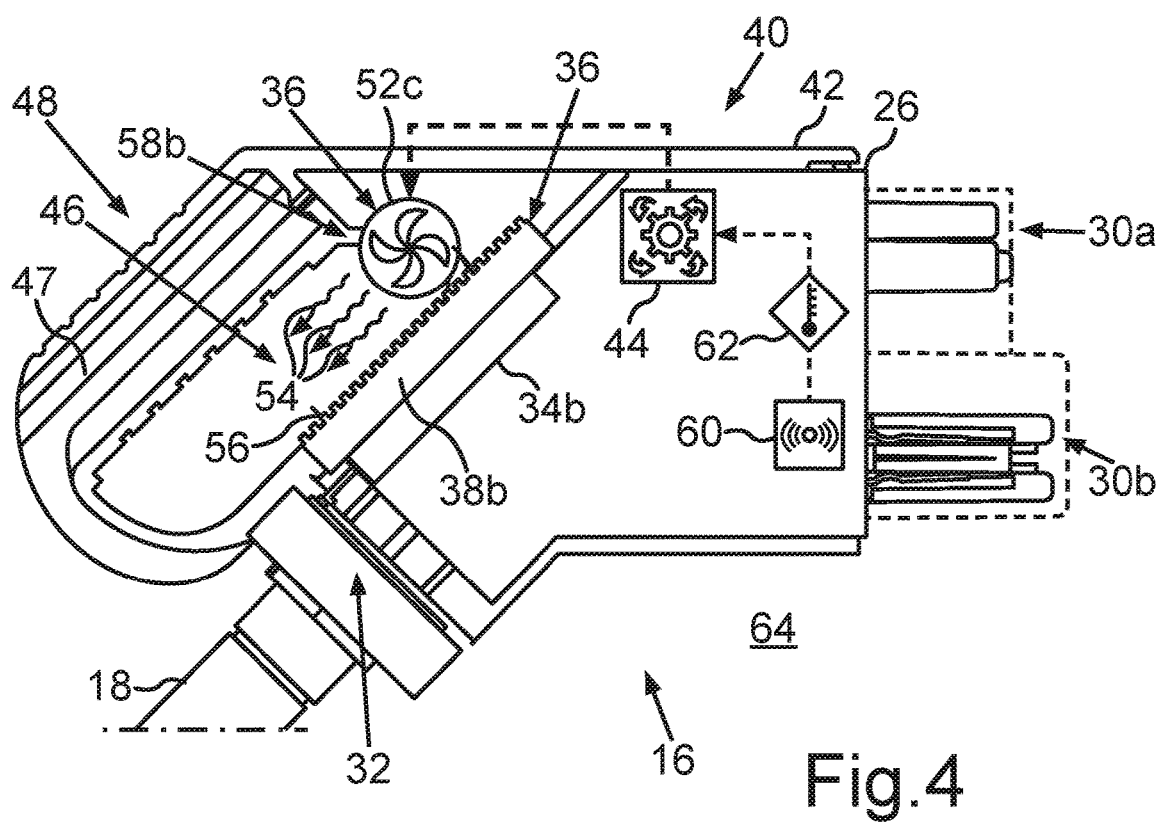
FIG. 4 schematically shows the charging plug having a third arrangement of the cooling unit.

The schematically enlarged charging plug 16 in FIGS. 2 to 4 comprises, in addition to the integrated power electronics 26, at least one contact element 30a, 30b for electrical coupling, that is to say reversible, detachable electrical connection to the at least one corresponding contact element of the charging socket 20 of the motor vehicle 10 and a connecting element 32 for the charging cable 18 of the charging station 12. For example, a first one of the at least one contact element 30a can be used to transfer alternating current and a second one of the at least one contact element 30b can be used to transfer direct current. Furthermore, the charging plug 16 comprises at least one semiconductor element 34a, 34b and a cooling unit 36 having at least one cooling element 38a, 38b for dissipating heat. The cooling element 38a, 38b forms part of a wall 40 of a housing 42 of the charging plug 16 and the at least one semiconductor element 34a, 34b is arranged on the cooling element 38a, 38b. It can be necessary in this case to design the housing 42 of the charging plug 16 to be watertight and/or dustproof.

For switching and/or for converting electric energy, the power electronics 26 of the charging plug 16 have a control unit 44 and the at least one semiconductor element 34a, 34b, for example at least one high-power semiconductor element, as part of the power electronics 26, which is actuated by means of the control device 44 for this purpose. For this purpose, the power electronics 26 can comprise a rectifier, a DC chopper, and alternatively or additionally a semiconductor switch. For example, the rectifier can comprise an active harmonic filter and the DC chopper can be electrically isolated and the semiconductor switch can be designed as a semiconductor relay.

The cooling unit 36 having the at least one cooling element 38a, 38b is used to dissipate heat. For this purpose, the at least one cooling element 38a, 38b can comprise a heat sink having at least one cooling fin for increasing a heat-dissipating surface. In this context, two different arrangements of the at least one cooling element 38a, 38b and the at least one semiconductor element 34a, 34b arranged thereon are shown in FIG. 2 to FIG. 4. Furthermore, as shown in FIG. 2, a first one of the cooling elements 38a and a second one of the at least one semiconductor element 34a can be arranged on the wall 40 of the housing 42 of the charging plug 16 opposite a handle 48. In FIG. 3 and FIG. 4, the second one of the cooling elements 38b and a second one of the at least one semiconductor element 34b can be arranged on a recessed grip 46 of the handle 48 of the charging plug 16.

Alternatively or additionally, both above-described arrangements of the at least one cooling element 38a, 38b and the at least one semiconductor element 34a, 34b arranged thereon can be integrated into the charging plug 16.

The cooling unit 36 can furthermore also comprise a cooling assembly 52a, 52b, 52c arranged on the housing 42 of the charging plug 16. The cooling assembly 52a, 52b, 52c can be designed as a fan, i.e., as a blower, and can be configured to generate a cooling air flow 54 indicated schematically by means of arrows in the direction of an outwardly oriented surface 56 of the at least one cooling element 38a, 38b, wherein convection of the cooling air flow 54 can be forced. In this context, three different arrangements of the cooling assembly 52a, 52b, 52c are shown in FIG. 2 to FIG. 4 in dependence on the respective arrangement of the at least one cooling element 38a, 38b. As is apparent from FIG. 2, the cooling assembly 52a, 52b, 52c can be arranged as as a first one of the cooling assemblies 52a on the wall 40 of the housing 42, shown opposite to the handle 48 here, arranged at the connecting element 32 for the charging cable 18. FIG. 3 and FIG. 4 show two respective ones of the cooling assemblies 52b, 52c, which can each be arranged in a region 54a, 54b of the charging plug 16 adjoining a handle bracket 46. FIG. 3 shows a second one of the cooling assemblies 52b, which is arranged in a first of the regions 54a, which is arranged at the connecting element 32 of the charging cable 18. FIG. 4 shows a third of the cooling assemblies 52c, which is arranged in a second of the regions 54b, which is arranged at the at least one cooling element 38b. Alternatively or additionally, all or two of the above-described arrangements of the cooling assembly 52a, 52b, 52c can be integrated into the charging plug 16.

Furthermore, the power electronics 26 can comprise a sensor unit 56, by means of which a temperature 58 of the surroundings 60 of the charging plug 16 and additionally or alternatively of the at least one semiconductor element 34a, 34b of the power electronics 26 is detected. Depending on the detected temperature 64, the cooling unit 36, in particular the cooling assembly 52a, 52b, 52c, is actuated by means of the control unit 44.

The charging procedure for transferring electric energy from the charging station 12 to the motor vehicle 10 can thus be implemented by means of the charging plug 16, which comprises the integrated power electronics 26 and the corresponding cooling unit 36.

The invention is based on the finding that present electric vehicles (so-called BEVs or battery electric vehicles), to charge a high-voltage accumulator (that is, the vehicle battery 28), are charged via a combined charging socket, i.e., charging socket 20, which implements the charging using direct current (DC) and the charging using alternating current (AC). For the combined charging socket there is a corresponding counterpart on the charging cable 18, the combined charging plug 16. In present charging systems 100 or at charging columns, respectively, i.e., at the charging stations 12, the charging plug 16 only fulfills two requirements here: providing a connection technology between the charging cable 18 and a plug contact, i.e., the at least one contact element 30a, 30b, and providing a so-called handling element, i.e., the handle 48, for a user, i.e., a customer or an operator. Consequently, there is only assembly and connection technology inside the charging plug 16.

Future charging systems 100 require the integration of power electronics 26 into the charging plug 16 or into the housing 42 of the charging plug 16. For example, the power electronics 26 can comprise the DC chopper (DC-DC converter) and/or the rectifier (AC-DC converter). However, this integration of the power electronics 26 requires active cooling of the charging plug 16 or its housing 42. Therefore, a radiator structure, i.e., the cooling unit 36, can be integrated into the charging plug 16, which is formed toward the outside having cooling ribs or the like, such as the at least one cooling fin. The complete power electronics 26 are integrated inside the charging plug 16. The power semiconductors, i.e., the at least one semiconductor element 34a, 34b, are connected in an electrically isolated manner in an interior of the charging plug 16 directly to a cooling plate, i.e., the at least one cooling element 38a, 38b. The convection is implemented by the cooling assembly 52a, 52b, 52c integrated into the charging plug 16 and designed as a fan, and the at least one semiconductor element 34a, 34b is indirectly cooled and the waste heat of the charging plug 16 is actively dissipated. The actuation of the cooling assembly 52a, 52b, 52c und/oder of the at least one semiconductor element 34a, 34b takes place directly via electronics integrated into the interior of the charging plug 16, i.e., the control device 44.

Overall, the examples show how a device, i.e., the cooling unit 36, for cooling the charging plug 16 having integrated power electronics 26 for electric vehicles, such as the motor vehicle 12, can be provided by the invention.

The invention claimed is:

1. A charging plug for a charging station for transferring electrical energy from the charging station to a corresponding charging socket of an electrical consumer, comprising:
    at least one contact element for electrically coupling the charging plug to the charging socket,
    a connecting element for at least mechanically connecting a charging cable of the charging station,
    at least one semiconductor element,
    a cooling unit for dissipating heat of the at least one semiconductor element, and
    integrated power electronics,
    wherein the cooling unit comprises a cooling assembly for generating a cooling air flow and a cooling element upon which the at least one semiconductor is arranged,
    wherein the cooling element forms part of a wall of a housing of the charging plug,
    wherein the cooling element and the at least one semiconductor component are together arranged in a recessed grip of a handle of the charging plug,
    wherein the cooling element is provided with at least one cooling fin external to the housing of the charging plug,
    wherein the cooling element is electrically isolated from the at least one semiconductor component by a thermally-conductive adhesive and/or paste, and
    wherein a control unit of the power electronics is configured to actuate the at least one semiconductor element as part of the integrated power electronics for switching and/or converting the electrical energy.

2. The charging plug as claimed in claim 1, wherein the cooling air flow is directed towards an outwardly oriented surface of the cooling element.

3. The charging plug as claimed in claim 1, wherein the cooling assembly is a fan for generating forced convection of the cooling air flow.

4. The charging plug as claimed in claim 1, wherein the control unit is configured to actuate the cooling unit in dependence on a temperature, detected by means of a sensor unit of the charging plug, of a surroundings of the charging plug and/or of the at least one semiconductor element of the power electronics.

5. The charging plug as claimed in claim 1, wherein the power electronics comprise an electrically isolated DC chopper which electrically insulates an output voltage of the charging plug from an input voltage of the charging plug.

6. The charging plug as claimed in claim 1, wherein the power electronics comprise a semiconductor relay for switching and/or converting the electric energy.

7. A charging system for transferring electrical energy from a charging station to an electrical consumer, comprising:
    a charging plug connected to the charging station by a charging cable and to the electrical consumer by a charging socket of the electrical consumer corresponding to the charging plug, the electrical consumer designed as a motor vehicle,
    wherein the motor vehicle is designed to receive a battery voltage at the charging socket and relay it, unchanged, to a vehicle battery of the motor vehicle,
    wherein the charging station is configured to receive a network voltage from a power grid and to relay it via the charging cable to the charging plug,
    wherein the charging plug is configured to convert the network voltage into the battery voltage by means of power electronics
    wherein the charging plug comprises at least one semiconductor element and a cooling unit for dissipating heat of the at least one semiconductor element,
    wherein the cooling unit comprises a cooling assembly for generating a cooling air flow and a cooling element upon which the at least one semiconductor is arranged,
    wherein the cooling element forms part of a wall of a housing of the charging plug,
    wherein the cooling element and the at least one semiconductor component are together arranged in a recessed grip of a handle of the charging plug,
    wherein the cooling element is provided with at least one cooling fin external to the housing of the charging plug, and
    wherein the cooling element is electrically isolated from the at least one semiconductor component by a thermally-conductive adhesive and/or paste.

\* \* \* \* \*